US010033402B2

(12) United States Patent
Oshita et al.

(10) Patent No.: US 10,033,402 B2
(45) Date of Patent: *Jul. 24, 2018

(54) LOW POWER ANALOG TO DIGITAL CONVERTER

(71) Applicant: Intel Corporation, Santa Clara, CA (US)

(72) Inventors: Takao Oshita, Portland, OR (US); George L. Geannopoulos, Portland, OR (US); David E. Duarte, Portland, OR (US); J. Keith Hodgson, Hillsboro, OR (US); James S. Ayers, Portland, OR (US); Avner Kornfeld, Portland, OR (US); Jonathan P. Douglas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/265,730

(22) Filed: Sep. 14, 2016

(65) Prior Publication Data

US 2017/0005670 A1    Jan. 5, 2017

Related U.S. Application Data

(63) Continuation of application No. 14/705,805, filed on May 6, 2015, now Pat. No. 9,520,895, which is a
(Continued)

(51) Int. Cl.
*H03M 3/00* (2006.01)
*H03M 1/00* (2006.01)
(Continued)

(52) U.S. Cl.
CPC .......... *H03M 3/458* (2013.01); *H03M 1/002* (2013.01); *H03M 1/123* (2013.01);
(Continued)

(58) Field of Classification Search
CPC ............ H03M 3/30; H03M 1/12; H03M 1/00; H03M 1/804
(Continued)

(56) References Cited

U.S. PATENT DOCUMENTS 5,030,954 A    7/1991    Ribner
5,585,716 A    12/1996   Gervais et al.
(Continued)

FOREIGN PATENT DOCUMENTS

WO    2014098971    6/2014

OTHER PUBLICATIONS

Advisory Action, dated Aug. 24, 2014, for U.S. Appl. No. 13/720,462.
(Continued)

*Primary Examiner* — Joseph Lauture
(74) *Attorney, Agent, or Firm* — Green, Howard & Mughal LLP

(57) ABSTRACT

Described is an analog to digital converter (ADC) which comprises: a sigma-delta modulator to receive an analog signal, the sigma-delta modulator operable to perform chopping to cancel common-mode noise; and one or more counters coupled to the sigma-delta modulator to generate a digital code representative of the analog signal.

28 Claims, 12 Drawing Sheets

Related U.S. Application Data continuation of application No. PCT/US2013/045503, filed on Jun. 12, 2013, which is a continuation of application No. 13/720,462, filed on Dec. 19, 2012, now Pat. No. 9,065,470.

(51) Int. Cl.
  *H03M 1/12* (2006.01)
  *H03M 1/80* (2006.01)

(52) U.S. Cl.
  CPC .......... *H03M 1/1245* (2013.01); *H03M 3/32* (2013.01); *H03M 3/34* (2013.01); *H03M 1/00* (2013.01); *H03M 1/12* (2013.01); *H03M 1/804* (2013.01); *H03M 3/30* (2013.01)

(58) Field of Classification Search
  USPC .................. 341/143, 155, 120, 156, 172
  See application file for complete search history.

(56) References Cited

U.S. PATENT DOCUMENTS

| | | | |
|---|---|---|---|
| 6,707,409 B1 | 3/2004 | Ignjatovic et al. | |
| 6,734,723 B2 | 5/2004 | Huijsing et al. | |
| 7,800,427 B2* | 9/2010 | Chae | H03H 19/004 327/337 |
| 7,894,789 B2 | 2/2011 | Sorrells et al. | |
| 7,999,710 B2 | 8/2011 | Matthews et al. | |
| 8,576,104 B2 | 11/2013 | Steensgaard-Madsen et al. | |
| 8,604,861 B1 | 12/2013 | Ceballos et al. | |
| 9,520,895 B2* | 12/2016 | Oshita | H03M 3/458 |
| 2007/0229331 A1* | 10/2007 | Pertijs | H03M 3/334 341/120 |
| 2009/0058698 A1 | 3/2009 | Chen | |
| 2011/0090998 A1 | 4/2011 | Zhang | |
| 2011/0254621 A1* | 10/2011 | Rice | H03F 3/387 330/9 |
| 2011/0063146 A1 | 11/2011 | Matthews et al. | |
| 2012/0062402 A1 | 3/2012 | Paynea | |
| 2012/0319885 A1 | 12/2012 | Chang | |
| 2013/0050003 A1* | 2/2013 | Wang | H03M 3/342 341/143 |
| 2016/0322979 A1* | 11/2016 | Upadhyaya | H03L 7/18 |

OTHER PUBLICATIONS

Final Office Action, dated Jul. 21, 2014, for U.S. Appl. No. 13/720,462.
First Notification for Rectification, dated Jan. 22, 2014, for China Patent Application No. 20130613473.X.
First Office Action, dated Nov. 26, 2013, for Taiwan Patent Application No. 102216532.
International Preliminary Report on Patentability for International Patent Application No. PCT/US2013/045503 dated Jul. 2, 2015, 8 pages.
International Preliminary Report on Patentability, dated Jul. 2, 2015, for PCT Patent Application No. PCT/US13/45503.
International Search Report and Written Opinion, dated Nov. 13, 2013, for PCT Patent Application No. PCT/US2013/045503.
Non-Final Office Action for U.S. Appl. No. 14/705,805, dated Dec. 14, 2015, 6 pages.
Non-Final Office Action, dated Jan. 2, 2015, for U.S. Appl. No. 13/720,462.
Non-Final Office Action, dated Apr. 2, 2014, for U.S. Appl. No. 13/720,462.
Non-Final Office Action, dated Dec. 12, 2013, for U.S. Appl. No. 13/720,462.
Notice of Allowance for U.S. Appl. No. 14/705,805, dated Apr. 15, 2016, 7 pages.
Notice of Allowance for U.S. Appl. No. 14/705,805, dated Aug. 3, 2016, 7 pages.
Notice of Allowance, dated Jan. 20, 2014, for Taiwanese Patent Application No. 102216532.
Notice of Allowance, dated Apr. 14, 2014, for China Patent Application No. 201320613473.X.
Notice of Allowance, dated Apr. 16, 2015, for U.S. Appl. No. 13/720,462.

* cited by examiner

LOW POWER ANALOG TO DIGITAL CONVERTER

CLAIM FOR PRIORITY

This application is a continuation of, and claims the benefit of priority to U.S. patent application Ser. No. 14/705,805, filed on 6 May 2015, which is a continuation of, and claims the benefit of priority to U.S. patent application Ser. No. 13/720,462, filed on 19 Dec. 2012, issued as U.S. Pat. No. 9,065,470 on 23 Jun. 2015, and of PCT Patent Application No. PCT/US13/45503, filed 12 Jun. 2013, entitled "LOW POWER ANALOG TO DIGITAL CONVERTER," and all of which are incorporated by reference in their entirety.

BACKGROUND

Analog to digital converters (ADCs) are used to convert an analog signal into a digital representative of the analog signal. However, designing a small low power, low cost, and accurate ADC (e.g., with 1 mV accuracy) is a challenge.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
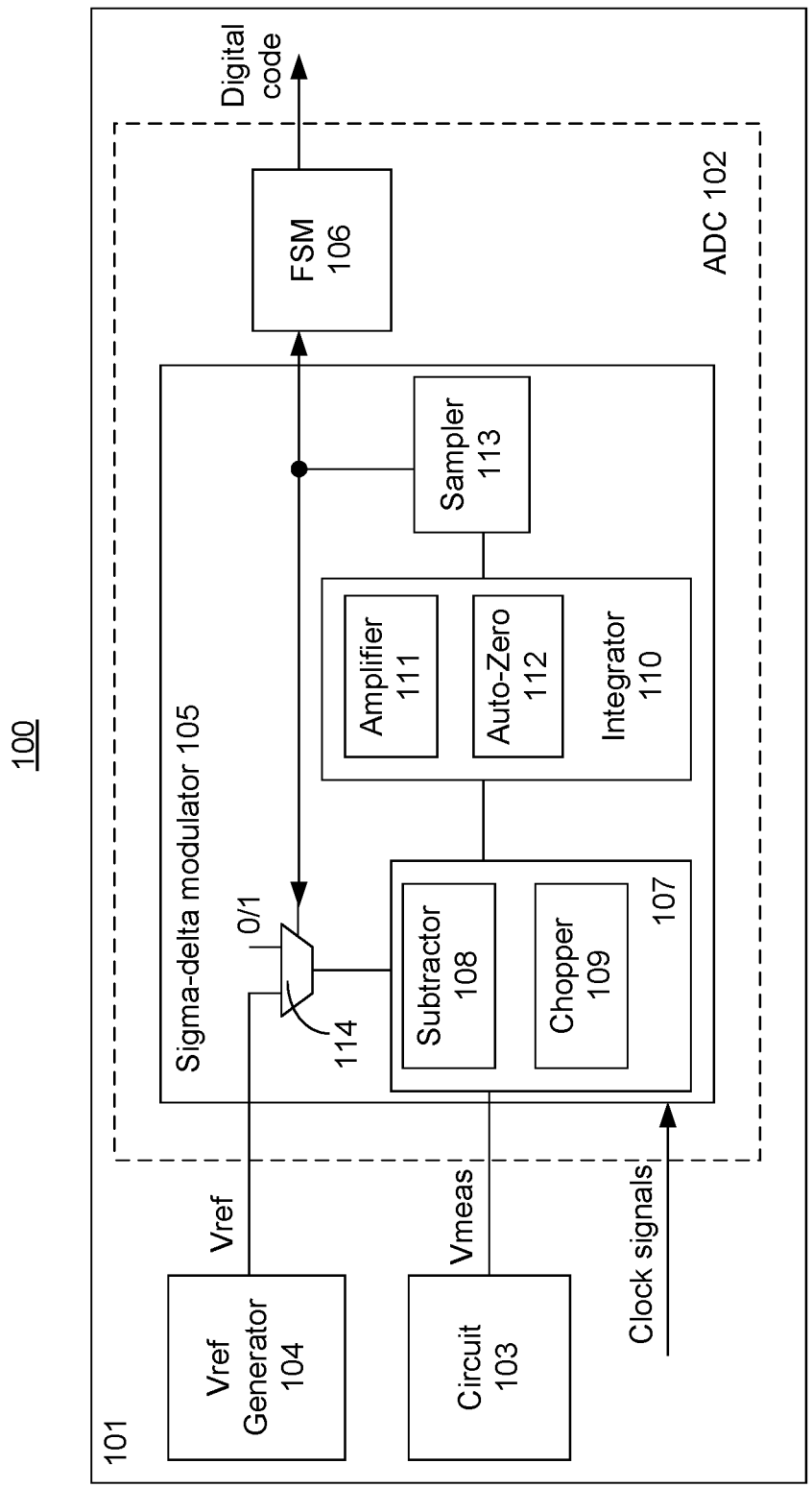
FIG. 1 is a high level block diagram of an analog to digital converter (ADC) in an integrated circuit, according to one embodiment of the disclosure.

The embodiments disclose an analog to digital converter (ADC) comprising a sigma-delta modulator to receive an analog signal, where the sigma-delta modulator is operable to perform chopping to cancel common-mode noise. In one embodiment, the ADC further comprises one or more counters coupled to the sigma-delta modulator to generate a digital code representative of the analog signal. In one embodiment, the sigma-delta modulator is a first order sigma-delta modulator. In one embodiment, the ADC is operable to provide 60 dB of signal to quantization noise ratio (SQNR) (e.g., 10 bits of resolution) with low bandwidth (e.g., 1 KHz), exhibits low power consumption (e.g., 100 µW on a 22 nm CMOS process technology), and has a footprint (area of ADC circuit on die) which is 10 to 20 times smaller than footprints of traditional ADCs.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," generally refers to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Transistors also include Tri-gate transistors and FinFETs. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a high level block diagram of an ADC in an integrated circuit (IC) 100, according to one embodiment of the disclosure. In one embodiment, IC 100 comprises a circuit 101 having an ADC 102, a reference generator 104, and an analog circuit 103.

In one embodiment, ADC 102 comprises a sigma-delta modulator 105 to receive a voltage reference Vref from the reference generator 104 and to receive an analog signal Vmeas from an analog (or mixed signal) circuit 103. In one embodiment, sigma-delta modulator 105 generates a sigma-delta modulated bit stream which is received by a finite state machine (FSM) 106. In one embodiment, FSM 106 converts the sigma-delta modulated bit stream into a digital code which represents the analog signal Vmeas.

Analog circuit 103 (or mixed signal circuit) can be any analog circuit or mixed signal circuit. For example, analog circuit 103 is any bandgap circuit, a thermal sensor, a phase-locked loop (PLL), an amplifier, a delay locked loop (DLL), voltage regulator, etc. The analog signal Vmeas can be any analog signal, of analog circuit 103, that is to be converted into a digital representation.

In one embodiment, sigma-delta modulator 105 comprises circuit 107 having a subtractor 108 and a chopper 109, an integrator 110, a sampler 113, and a multiplexer 114. In one embodiment, the function of the chopper 109 is to allow the sigma-delta modulator 105 to operate in a time-multiplexed pseudo-differential manner. In one embodiment, chopper 109 is operable to cancel common-mode noise from amplifier 111. Examples of common-mode noise include Direct Current (DC) leakage, Alternating Current (AC) power supply noise, etc. In one embodiment, sigma-delta modulator 105 is a single-ended sigma-delta modulator. In other embodiments, sigma-delta modulator 105 is a pseudo differential sigma-delta modulator.

In one embodiment, multiplexer 114 receives reference voltage Vref and provides it to circuit 107 which also receives the analog signal Vmeas as input. In one embodiment, integrator 110 and sampler 113 convert the ratio of Vmeas to Vref into a sigma-delta modulated bit stream (or pulse density modulated bit stream) for FSM 106.

In one embodiment, FSM 106 includes a first counter which is a free running counter to count measurement cycles, and a second counter to count a number of cycles where the modulator outputs a known bit e.g., 1. In one embodiment, the ratio of the output (count value) of the second counter versus the output (count value) of the first counter is the pulse density of the sigma-delta modulated bit stream (output of sampler 113) which corresponds to the ratio Vmeas to Vref.

In one embodiment, integrator 110 comprises an amplifier 111 and circuit 112 for performing auto-zero function. The term "auto-zero" generally refers to a mechanism to cancel DC offset of an amplifier (e.g., amplifier 111). The auto-zero function performed by the circuit 112 removes the impact of process, temperature, and voltage (PVT) variations of the trip point of amplifier 111.

In one embodiment, amplifier 111 is an inverter. In one embodiment, amplifier 111 is a cascode inverting amplifier.

In one embodiment, amplifier 111 is a single or multi-stage operational amplifier (OPAMP). In one embodiment, amplifier 111 (e.g., inverter) and the sampler 113 perform the function of an analog comparator based quantizer. In one embodiment, chopper 109, integrator 110, and sampler 113 use different (or same) phases of the clock signals to perform their functions.

Figure 2:
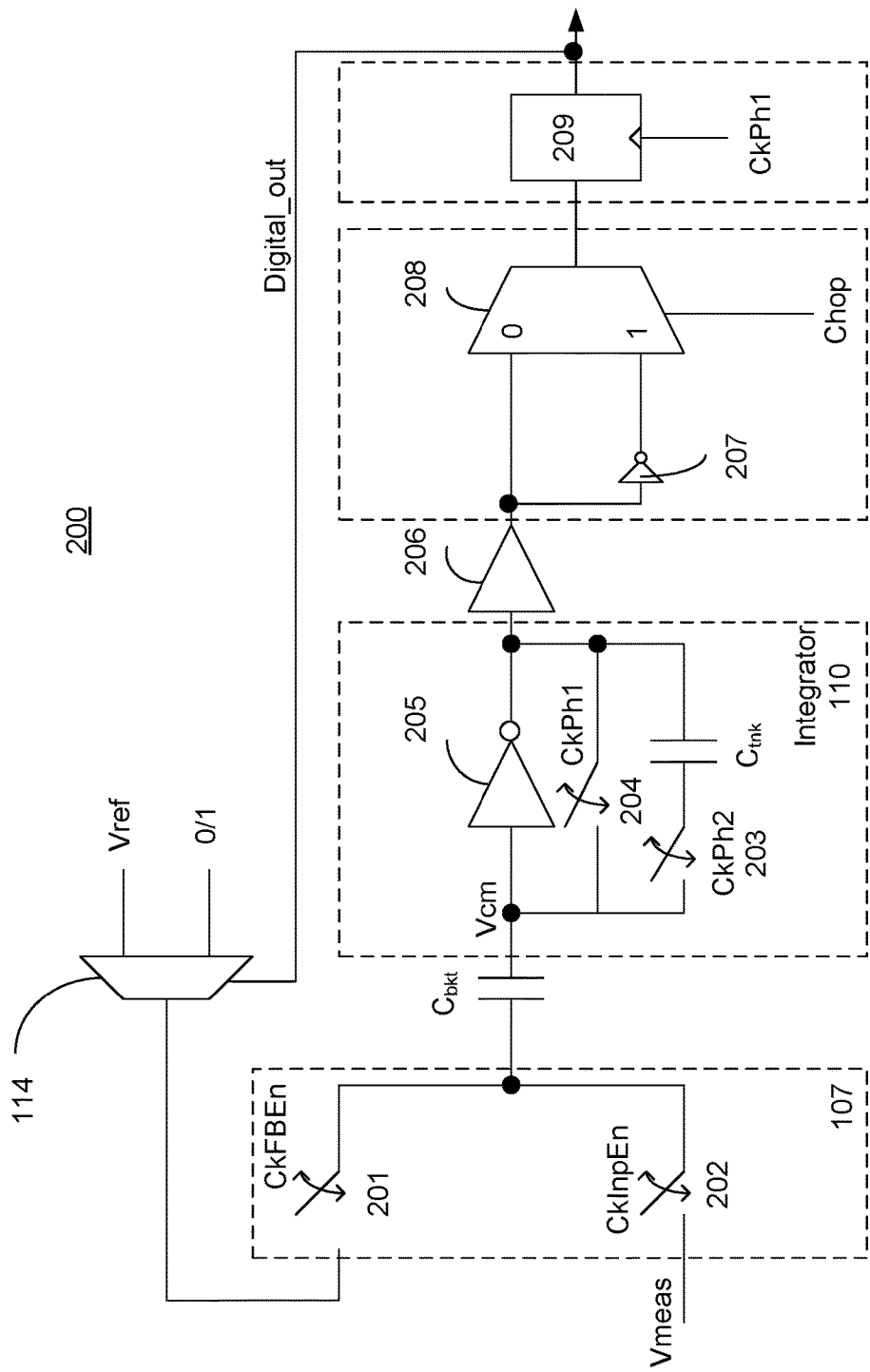
FIG. 2 is a sigma-delta modulator of an ADC with chopping and auto-zero functions, according to one embodiment of the disclosure.

FIG. 2 is a sigma-delta modulator 200 (e.g., 105) of an ADC (e.g., 102) with chopping and auto-zero functions, according to one embodiment of the disclosure. It is pointed out those elements of FIG. 2 having the same reference numbers (or names) as the elements of any other figure can operate or function in any manner similar to that described, but are not limited to such.

In one embodiment, sigma-delta modulator 200 comprises switches 201 and 202 coupled to capacitor $C_{bkt}$, where switches 201 and 202 either couple Vmeas to $C_{bkt}$ or an output of the multiplexer 114 to $C_{bkt}$. In one embodiment, switches 201 and 202 are turned on or off by signals CkFBEn and CkInpEn respectively, where CkFBEn and CkInpEn are clock signals derived from CkPh1 or CkPh2 clock signals.

For example, CkPh1 is the high phase of the clock signal while CkPh2 is the low phase of the clock signal or vise versa. In one embodiment, depending on whether chopping function is enabled or disabled, one of CkPh1 or CkPh2 is used for CkFBEn and CkInpEn, where CkPh1 and CkPh2 are opposite phases of the clock signal (of FIG. 1). For example, if chopping is enabled, then CkInpEn is same as CkPh2 and CkFBEn is same as CkPh1 otherwise CkInpEn is same as CkPh1 and CkFBEn is same as CkPh2. In one embodiment, switches 201 and 202, multiplexer 208, and inverter 207 form the chopping function/circuit 109 of FIG. 1.

Figure 7:
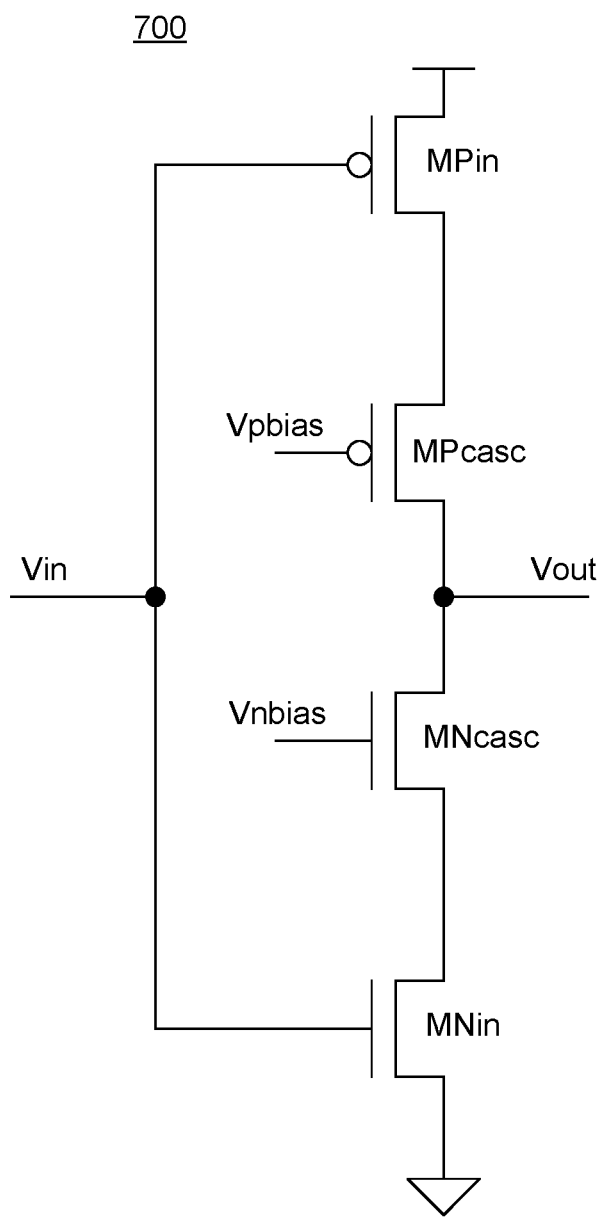
FIG. 7 is a cascode inverter based amplifier for the sigma-delta modulator, according to one embodiment of the disclosure.

In one embodiment, capacitor $C_{bkt}$ is coupled at another end to integrator 110. In one embodiment, integrator 110 comprises an inverter 205 (e.g., amplifier 111) with its input node Vcm coupled to the other end of the capacitor $C_{bkt}$. In one embodiment, input capacitor $C_{bkt}$ acts as a switched capacitor subtractor (e.g., subtractor 108) and to implement auto-zero function simultaneously. In one embodiment, inverter 205 (also called amplifier 205) is implemented as a cascode inverter amplifier to increase its output impedance, hence increasing its gain. One such embodiment of the inverter 205 (also called amplifier 205) is shown in FIG. 7.

Referring back to FIG. 2, in one embodiment, switch 204 is coupled between the input and output of inverter 205, where switch 204 is controlled by CkPh1. In such an embodiment, switch 204 performs the function of auto-zero 112 of FIG. 1.

In one embodiment, the process of auto-zeroing of amplifier 205 occurs during the first phase (phase 1) of operation, where phase 1 corresponds to CkPh1. In one embodiment, during phase 1, switch 204 closes and $C_{bkt}$ stores the information about the trip point of amplifier 205 as common-mode voltage Vcm. In one embodiment, during the second phase (phase 2), switch 203 closes and the trip point information stored on Vcm is cancelled, where phase 2 corresponds to CkPh2. In one embodiment, the process of auto-zeroing occurs in each clock cycle, where CkPh1 is phase 1 of the clock cycle, and where CkPh2 is phase 2 of the clock cycle.

In one embodiment, even when DC supply level changes and the trip point of amplifier 205 moves, amplifier 205 tracks the trip point at each auto-zero phase. In such an embodiment, common-mode voltage i.e., the trip point of amplifier 205, is canceled out in the second phase. Cancelling the common-mode voltage improves DC power supply rejection ratio (PSRR). Another non-limiting technical effect of auto-zeroing is that cancelling the common-mode voltage rejects flicker noise produced by the amplifier 205.

In one embodiment, switch 203 is coupled at one end with capacitor $C_{tnk}$ so that switch 203 and the capacitor $C_{tnk}$ are coupled in series. In one embodiment, the other end of switch 203 is coupled to the input of inverter 205 while one end of $C_{tnk}$ is coupled to the output of inverter 205 such that the combination of switch 203 and $C_{tnk}$ are in parallel to switch 204 and inverter 205. In one embodiment, switch 203 is controlled by CkPh2. In one embodiment, switch 203 and capacitor $C_{tnk}$ perform the function of integration with node Vcm being the storage node. In this embodiment, the circuit topology of integrator 110 is tolerable to leakage (e.g., drain to source leakage) of switches 203 and 204. Various embodiments of switches 201, 202, 203, and 204 are described with reference to FIGS. 4-6.

Referring back to FIG. 2, in one embodiment the size of $C_{bkt}$ impacts operation headroom. In one embodiment, $C_{bkt}$ is 20 fF. In one embodiment, $C_{tnk}$ is 100 µF. In other embodiments, other values for $C_{bkt}$ or $C_{tnk}$ may be used. In one embodiment, capacitance of $C_{tnk}$ is at least a couple times greater than the capacitance of $C_{bkt}$. A lower ratio of capacitances of $C_{tnk}$ to $C_{bkt}$ may cause the internal voltage signals of integrator 110 to be closer to the rail which may impact device headroom and degrade accuracy.

In one embodiment, output of inverter 205 is buffered by buffer 206. In one embodiment, output of buffer 206 is received as input to multiplexer 208. In one embodiment, multiplexer 208 is a 2:1 multiplexer which is operable to select, via signal "Chop," one of the outputs of buffer 206 or an inverted version (by inverter 207) of the output of buffer 206. In one embodiment, output of multiplexer 208 is sampled by sampler 209 (same as 113) by the sampling clock CkPh1. In one embodiment, sampler 209 is a flip-flop. In other embodiments, other sequential units may be used for implementing sampler 209. In one embodiment, output of sampler 209 is a sigma modulated digital bit stream "Digital_out" which is received by FSM 106 and is also used as a select signal for multiplexer 114. In one embodiment, Digital_out causes multiplexer 114 to select one of Vref or a logical zero or one as input to switch 201.

In one embodiment, CkPh1 and CkPh2 are non-overlapping phases of the clock signal. In one embodiment, CkInpEn is the same as CkPh1 while CkFBEn is the same as CkPh2 when "Chop" is logical low. As shown in FIG. 2, a logical low "Chop" causes multiplexer 208 to select the output of buffer 206 as input to sampler 209. In one embodiment, CkInpEn is the same as CkPh2 while CkFBEn is the same as CkPh1 when "Chop" is logical high. In such an embodiment, a logical high "Chop" causes multiplexer 208 to select the output of inverter 207 as input to sampler 209.

In one embodiment, a pseudo differential operation of the sigma-delta modulator 200 is achieved by executing (running) the ADC twice. For example, ADC 102 is enabled to read analog voltages Vmeas for the case when "Chop" is logical low and when "Chop" is logical high. In one embodiment, the pseudo differential operation is a time-multiplexed pseudo differential operation. In one embodiment, by taking the average of the outputs of ADC 102 for each of the two executions (i.e., one with "Chop" being logical low and another with "Chop" being logical high), an equivalent time multiplexed pseudo-differential operation of sigma-delta modulator 200 is achieved without the extra silicon (or area and power) cost of having two copies of sigma-delta modulator 200.

In one embodiment, accuracy of ADC 102 is determined by performing the two executions (i.e., one with "Chop" being logical low and another with "Chop" being logical high) because the delta (or difference) between the outputs of ADC 102 with the two executions strongly correlates with error in ADC 102. As a result, a more accurate digital representation of the analog signal Vmeas can be achieved by the described embodiments.

Figure 3:
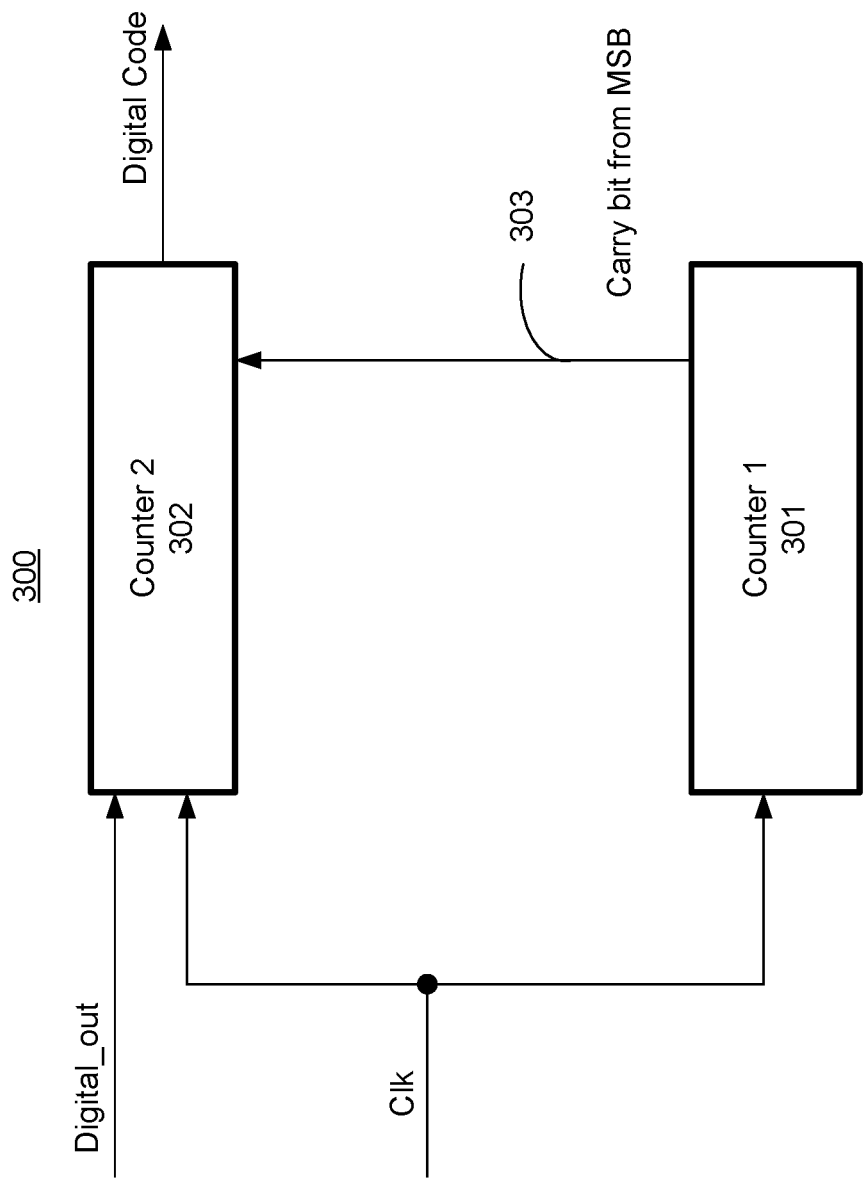
FIG. 3 is a digital portion of the ADC, according to one embodiment of the disclosure.

FIG. 3 is digital portion 300 (e.g., FSM 106) of the ADC (e.g., ADC 102), according to one embodiment of the disclosure. It is pointed out those elements of FIG. 3 having the same reference numbers (or names) as the elements of any other figure can operate or function in any manner similar to that described, but are not limited to such.

In one embodiment, digital portion 300 comprises a first counter 301 and a second counter 302 coupled together as shown. In one embodiment, output of sampler 209 (or 113) is received as a digital sigma-delta modulated bit stream. Counters 301 and 302 can be implemented with any known counter designs. In one embodiment, counters 301 and 302 count every clock cycle Clk, where Clk is same as CkPh1.

In one embodiment, counter 301 (also called the primary counter) is a free running counter that counts measurement cycles. In one embodiment, counter 302 counts the number of cycles the Digital_out signal is logically high. In one embodiment, the ratio of the count value of counter 302 to count value of counter 301 is the pulse density of the sigma-delta modulated bit stream (also called Digital_out), and correlates with the ratio Vmeas to Vref.

In one embodiment, carry signal 303 from counter 301 is used to freeze the counter 302 from counting indicating a final digital code (Digital_code) that represents the analog signal Vmeas. In one embodiment, carry signal 303 is the most significant bit (MSB) of the counter value from counter 301.

Figure 4:
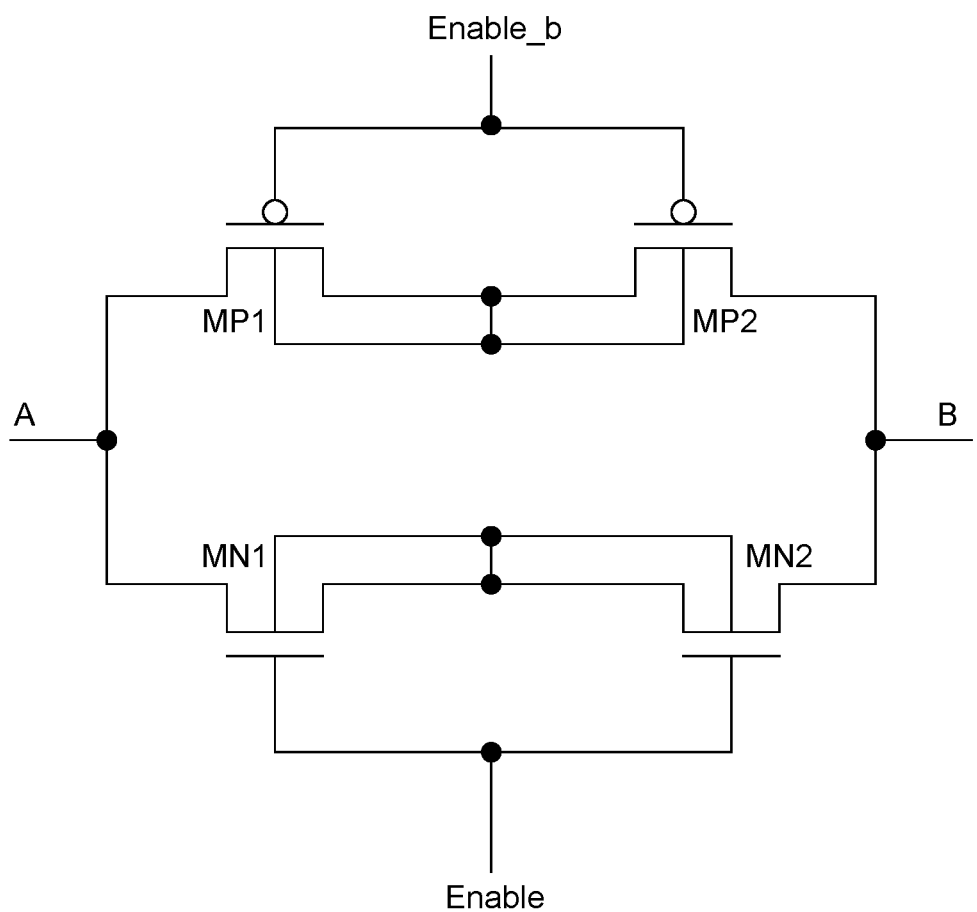
FIG. 4 is a junction leakage tolerant switch for the sigma-delta modulator, according to one embodiment of the disclosure.

FIG. 4 is a junction leakage tolerant switch 400 for the sigma-delta modulator (e.g., 105 and 200), according to one embodiment of the disclosure. It is pointed out those elements of FIG. 4 having the same reference numbers (or names) as the elements of any other figure can operate or function in any manner similar to that described, but are not limited to such.

In one embodiment, switch 400 comprises two p-type devices MP1 and MP2 coupled together in series, and two n-type devices MN1 and MN2 coupled together in series. In one embodiment, p-type devices MP1 and MP2 and n-type devices MN1 and MN2 are formed in a triple-well process. Switch 400 can be used for any or all of switches 201, 202, 203, and 204.

In one embodiment, bulk (body) terminals of MP1 and MP2 are coupled together and also coupled to a shared node (e.g., source or drain) between MP1 and MP2. In one embodiment, uncommon (non-shared) nodes of MP1 and MP2 are the switch inputs and/or outputs (A and/or B, respectively). In one embodiment, bulk (body) terminals of MN1 and MN2 are coupled together and also coupled to a shared node (e.g., source or drain terminals) between MN1 and MN2. In one embodiment, uncommon (non-shared) nodes of MN1 and MN2 are the switch inputs and/or outputs (A and/or B, respectively). In this embodiment, gate terminals of n-type devices MN1 and MN2 are controlled by an Enable signal (e.g., CkPh1, CkPh2, CkFBEn, or CkInpEn). In this embodiment, gate terminals of p-type devices MP1 and MP2 are controlled by an inverted Enable signal i.e., Enable_b (e.g., inverted version of CkPh1, CkPh2, CkFBEn, or CkInpEn).

Figure 5:
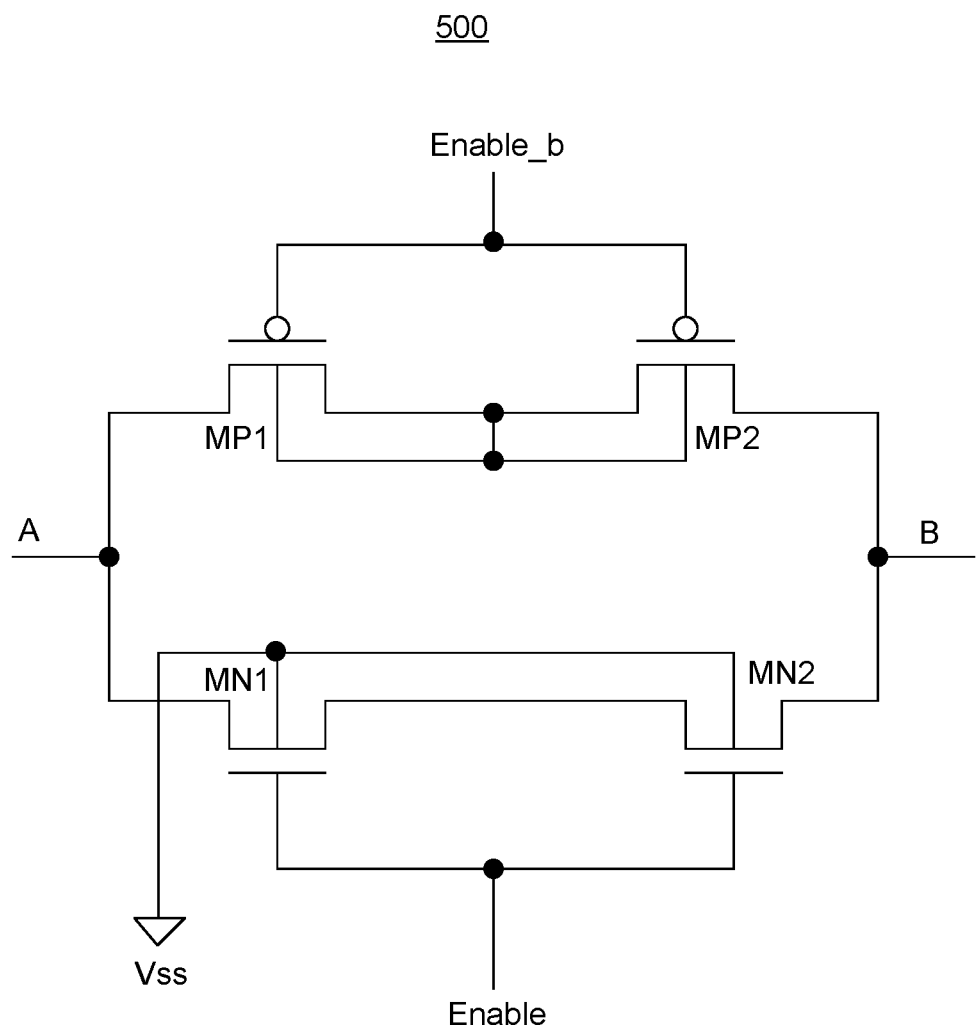
FIG. 5 is a junction leakage tolerant switch for the sigma-delta modulator, according to one embodiment of the disclosure.

FIG. 5 is a junction leakage tolerant switch 500 for the sigma-delta modulator, according to one embodiment of the disclosure. It is pointed out those elements of FIG. 5 having the same reference numbers (or names) as the elements of any other figure can operate or function in any manner similar to that described, but are not limited to such.

In one embodiment, switch 500 comprises two p-type devices MP1 and MP2 coupled together in series, and two n-type devices MN1 and MN2 coupled together in series. In one embodiment, p-type devices MP1 and MP2 and n-type devices MN1 and MN2 are formed in a non-triple-well process. Switch 500 can be used for any or all of switches 201, 202, 203, and 204.

In one embodiment, bulk (or body) terminals of MP1 and MP2 are coupled together and also coupled to a shared node (e.g., source or drain) between MP1 and MP2. In one embodiment, uncommon (non-shared) nodes of MP1 and MP2 are the switch inputs and/or outputs (A and/or B, respectively). In one embodiment, bulk (body) terminals of MN1 and MN2 are coupled together and tied to ground (Vss). In one embodiment, uncommon (non-shared) nodes of MN1 and MN2 are the switch inputs and/or outputs (A and/or B, respectively). In this embodiment, gate terminals of n-type devices MN1 and MN2 are controlled by an Enable signal (e.g., CkPh1, CkPh2, CkFBEn, or CkInpEn). In this embodiment, gate terminals of p-type devices MP1 and MP2 are controlled by an inverted Enable signal i.e., Enable_b (e.g., inverted version of CkPh1, CkPh2, CkFBEn, or CkInpEn).

Figure 6:
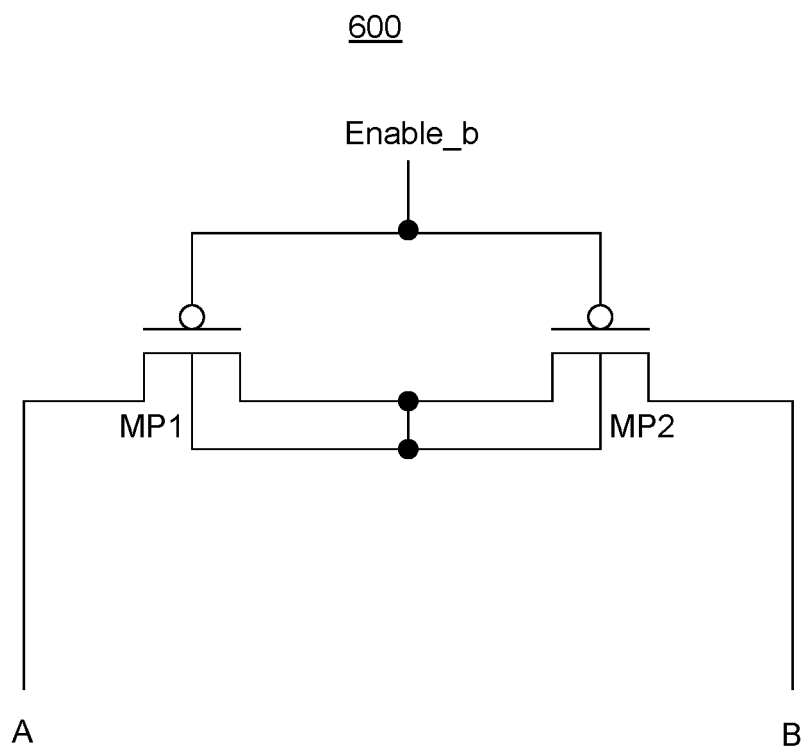
FIG. 6 is a junction leakage tolerant switch for the sigma-delta modulator, according to one embodiment of the disclosure.

FIG. 6 is a junction leakage tolerant switch 600 for the sigma-delta modulator, according to one embodiment of the disclosure. It is pointed out those elements of FIG. 6 having the same reference numbers (or names) as the elements of any other figure can operate or function in any manner similar to that described, but are not limited to such.

In one embodiment, switch 600 comprises two p-type devices MP1 and MP2 coupled together in series. In one embodiment, p-type devices MP1 and MP2 are formed in a non-triple-well process. Switch 600 can be used for any or all of switches 201, 202, 203, and 204. In one embodiment, bulk (body) terminals of MP1 and MP2 are coupled together and also coupled to a shared node (e.g., source or drain terminals) between MP1 and MP2. In one embodiment, uncommon (non-shared) nodes (e.g., source or drain) of MP1 and MP2 are the switch inputs and/or outputs (A and/or B, respectively). In this embodiment, gate terminals of p-type devices MP1 and MP2 are controlled by an inverted Enable signal i.e., Enable_b (e.g., inverted version of CkPh1, CkPh2, CkFBEn, or CkInpEn). In one embodiment, (e.g., node Vcm of FIG. 2.) is higher than the threshold voltage of the p-type device MP1.

FIG. 7 is a cascode inverter 700 (e.g., amplifier 111, inverter 205) based amplifier for the sigma-delta modulator, according to one embodiment of the disclosure. In one embodiment, cascode inverter 700 comprises p-type devices MPin and MPcasc, and n-type devices MNcasc and MNin coupled together in series as shown. In one embodiment, input node Vin of cascode inverter 700 couples to the gate terminals of MPin and MNin. In one embodiment, output node Vout couples to the drain terminals of MPcasc and MNcasc. In one embodiment, MPcasc and MNcasc provide the additional output impedance looking into amplifier 700 from the output node Vout. In one embodiment, gate terminals of MPcasc and MNcasc are biased by Vpbias and Vnbias to control the resistance of MPcasc and MNcasc. In one embodiment, even when the input devices MPin and MNin leave their respective saturation regions, MPcasc and MNcasc continue to operate in deep saturation region. In this embodiment, output impedance of cascode inverter 700 remains high (and thus the gain remains high) regardless of the DC level of the input voltage Vin.

Figure 8A:
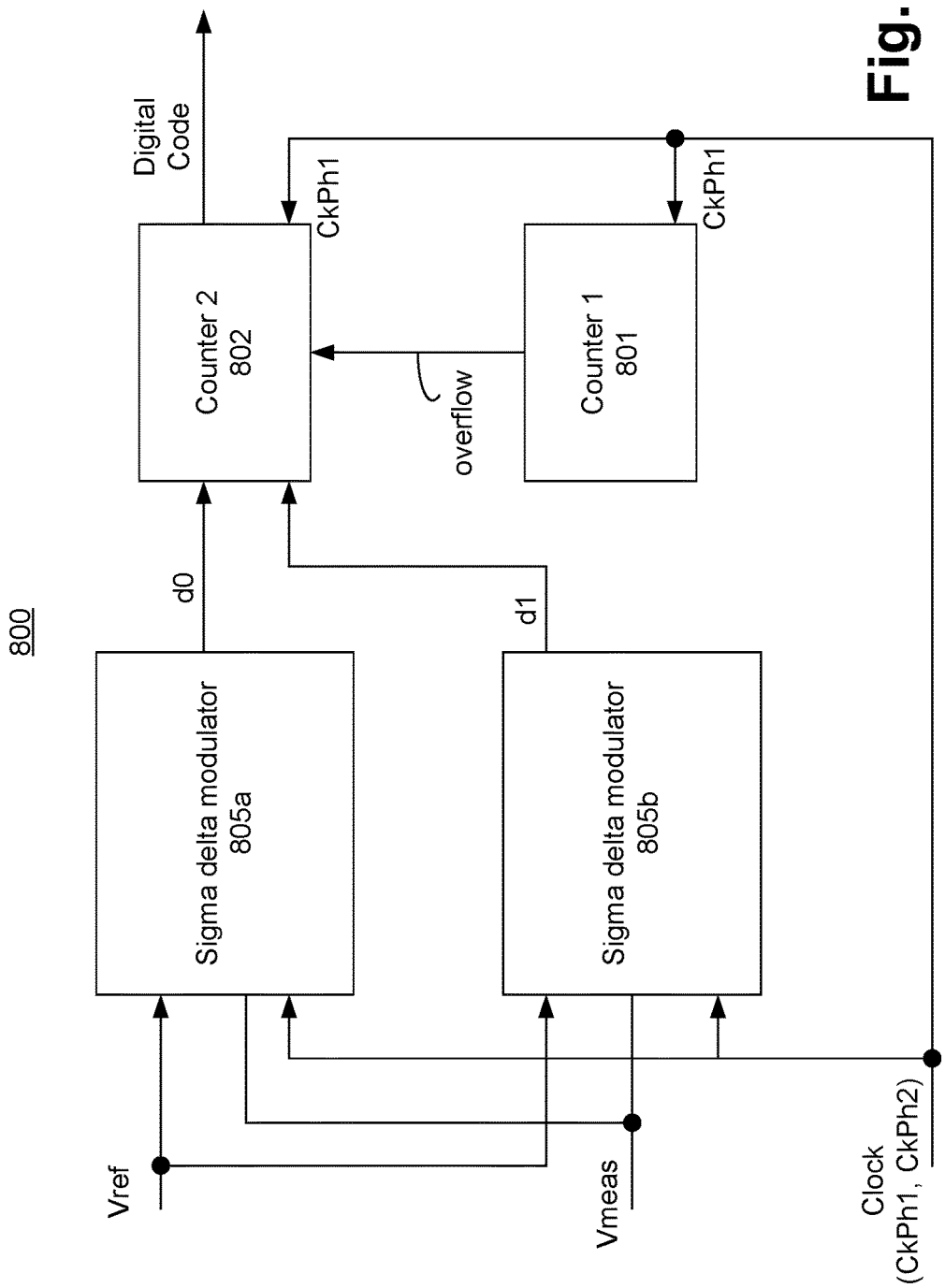
FIG. 8A is a high level pseudo-differential ADC with chopping and auto-zero functions, according to one embodiment of the disclosure.

FIG. 8A is a high level pseudo-differential ADC 800 with chopping and auto-zero functions, according to one embodiment of the disclosure. It is pointed out that those elements of FIG. 8A having the same reference numbers (or names) as the elements of any other figure can operate or function in any manner similar to that described, but are not limited to such. Unlike a single ended implementation of the sigma-delta modulator as discussed with reference to FIG. 2, the pseudo-differential ADC 800 comprises complementary sigma-delta modulators. In this embodiment, each of the complementary sigma-delta modulators produces sigma-delta modulated bit stream which are input into a digital section comprising two counters.

In one embodiment, ADC 800 comprises, counter 1 801 (primary counter) and counter 2 802 (secondary counter), and complementary sigma-delta modulators 805a and 805b. In this embodiment, the process of chopping (as indicated with the signal "Chop" in FIG. 2) is implemented with complementary sigma-delta modulators 805a (first sigma-delta modulator) and 805b (second sigma-delta modulator). In one embodiment, primary counter 801 is the free running counter, and it counts the measurement cycles. In one embodiment, secondary counter 802 operation depends on two bits of information from the sigma delta modulators 805a and 805b. One bit of information, d0, comes from first sigma-delta modulator 805a, and the other bit of information, d1, comes from second sigma-delta modulator 805b.

In one embodiment, when both d0 and d1 are one, then secondary counter 802 increments by two, else when either d0 or d1 is one, then secondary counter 802 increments by one, and else secondary counter 802 retains its value. In one embodiment, the ratio of (secondary counter value) vs. (primary counter value*2) is the pulse density of the sigma delta modulated bit streams d0 and d1 which corresponds to the ratio Vmeas to Vref.

Some non-limiting technical effects of the pseudo-differential ADC 800 include improved common-mode noise rejection. For example, common-mode noise from AC noise from the power supply and leakage noise are reduced. Another non-limiting technical effect of the pseudo-differential ADC 800 is that read latency of the digital result is cut by half over the implementation of FIG. 2. For example, since two bits of information (d0 and d1) are generated by the first and second sigma-delta modulators 805a and 805b at each cycle rather than one bit of information (Digital_out of FIG. 2), read latency is two times shorter than the single ended implementation of FIG. 2 to derive a single code with the same resolution.

Figure 8B:
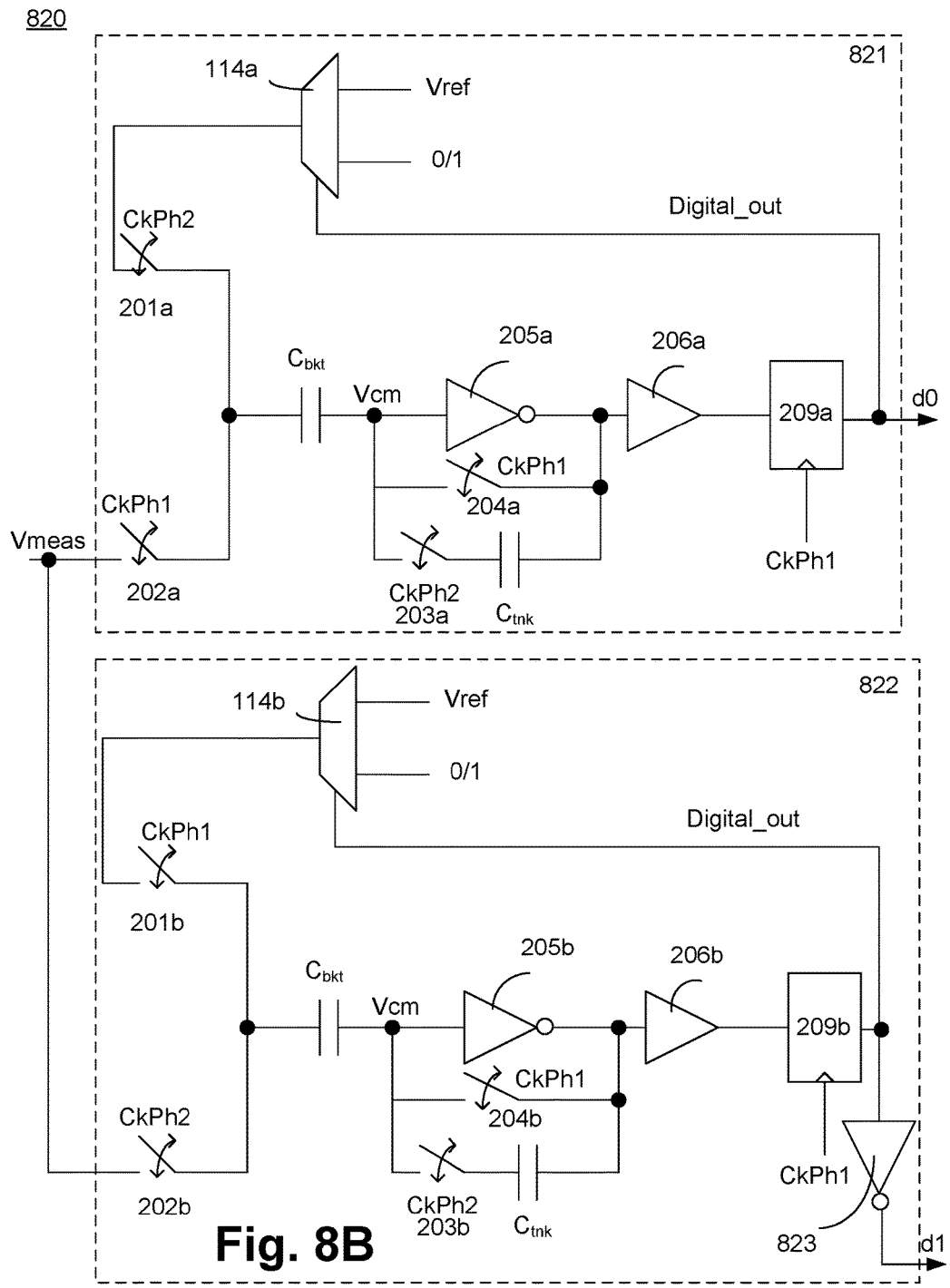
FIG. 8B is a pair of complementary sigma-delta modulators of the pseudo-differential ADC with chopping and auto-zero functions, according to one embodiment of the disclosure.

FIG. 8B is a pseudo-differential sigma-delta modulator 820 with chopping and auto-zero functions, according to one embodiment of the disclosure. It is pointed out those elements of FIG. 8B having the same reference numbers (or names) as the elements of any other figure can operate or function in any manner similar to that described, but are not limited to such. In this embodiment, the process of chopping (as indicated with the signal "Chop" in FIG. 2) is implemented with complementary sigma-delta modulators forming pseudo-differential sigma-delta modulator 800.

In one embodiment, pseudo-differential sigma-delta modulator 820 comprises a first sigma-delta modulator 821

(e.g., 805a of FIG. 8A) and a second sigma-delta modulator 822 (e.g., 805b of FIG. 8B). In this embodiment, suffix 'a' is appended to all reference numbers of FIG. 2 for the first sigma-delta modulator 821. For example, switch 202a corresponds to switch 202 of FIG. 2, switch 204a corresponds to 204 of FIG. 2, switch 203a corresponds to switch 203 of FIG. 2, multiplexer 114a corresponds to multiplexer 114 of FIG. 2, and sampler 209a corresponds to sampler 209 of FIG. 2.

In this embodiment, suffix 'b' is appended to all reference numbers of FIG. 2 for the second sigma-delta modulator 822. For example, switch 202b corresponds to switch 202 of FIG. 2, switch 204b corresponds to 204 of FIG. 2, switch 203b corresponds to switch 203 of FIG. 2, multiplexer 114b corresponds to multiplexer 114 of FIG. 2, and sampler 209b corresponds to sampler 209 of FIG. 2. So as not to obscure the embodiments, function and structure of components of FIG. 2 which have suffix 'a' and 'b' in FIG. 8 are not discussed in detail because they have the same function or structure as discussed with reference to FIG. 2.

In one embodiment, first and second sigma-delta modulators 821 and 822 receive the same analog signal Vmeas, but generate pseudo-differential sigma-delta modulated digital bit streams d0 and d1 respectively. In this embodiment, switches 201a and 202a of the first sigma-delta modulator 821 are controlled by signals CkPh2 and CkPh1 respectively, while switches 201b and 202b of the second sigma-delta modulator 822 are controlled by signals CkPh1 and CkPh2 respectively.

With reference to FIG. 2, when "Chop" is set to logical low, the sigma-delta modulator operates as shown by first sigma-delta modulator 821, and when "Chop" is set to logical high, the sigma-delta modulator operates as shown by second sigma-delta modulator 822. To correct the output polarities, the function of inverter 207 is indicated by inverter 823 at the output of sampler 209b.

In one embodiment, both first and second sigma-delta modulators 821 and 822 are complementary to each other such that first sigma-delta modulator 821 measures Vmeas while second sigma-delta modulator 822 measures Vref-Vmeas. In one embodiment, the final A2D converter output reading is an average of the digital outputs d0 and d1. In one embodiment, the process of chopping cancels out the offset error introduced by inverters 205a and 205b. The process of chopping also improves tolerance to gain variation of amplifiers 205a and 205b. The process of chopping improves PSRR (power supply rejection ratio) against AC noise, for example, when AC noise has strong correlation with operational clock frequency. The process of chopping also improves leakage tolerance by cancelling out leakage effect.

Figure 9:
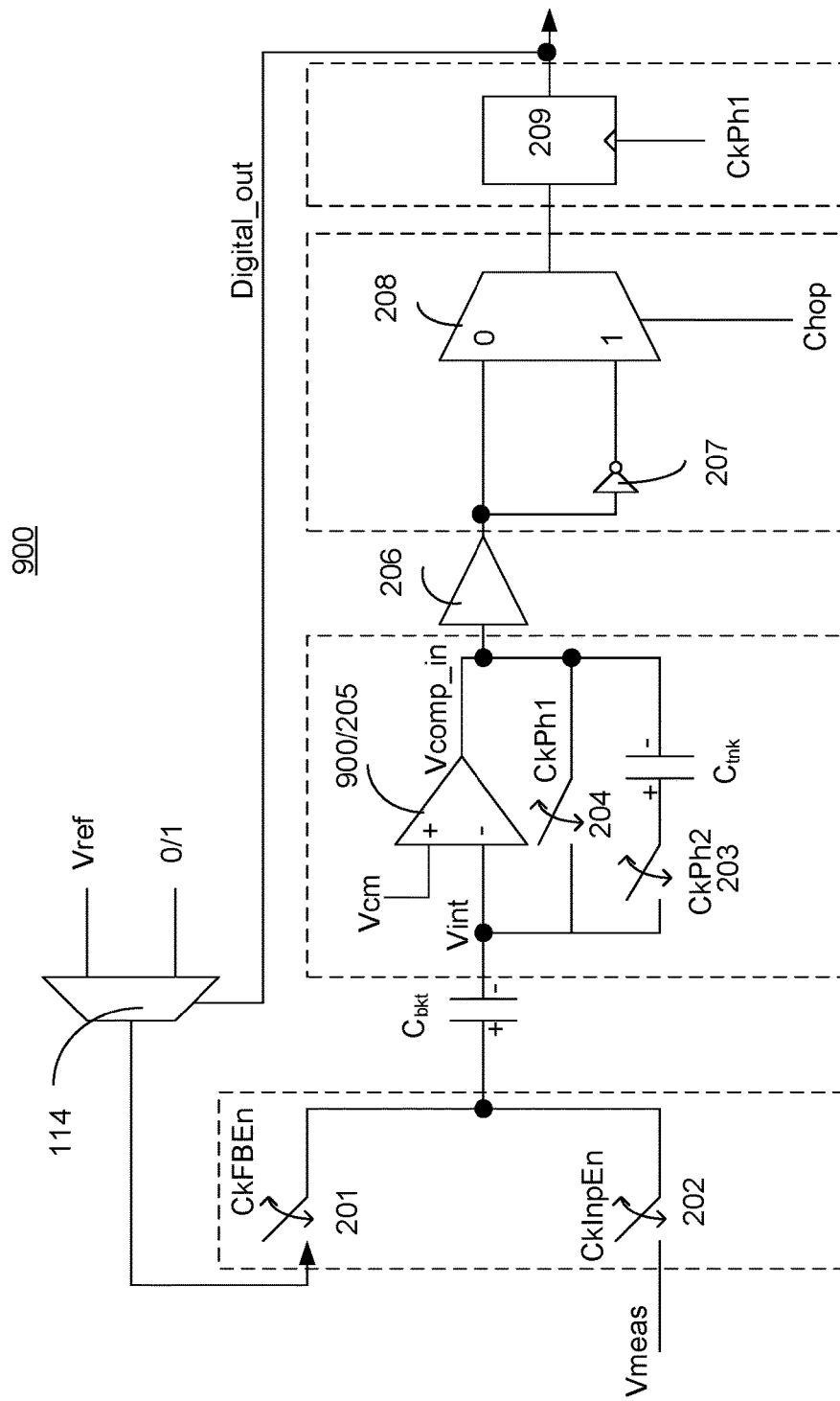
FIG. 9 is a mathematical model of a sigma-delta modulator of an ADC with chopping and auto-zero functions, according to one embodiment of the disclosure.

FIG. 9 is a circuit illustration of a mathematical model 900 of a sigma-delta modulator of an ADC (e.g., 102) with chopping and auto-zero functions, according to one embodiment of the disclosure. It is pointed out those elements of FIG. 9 having the same reference numbers (or names) as the elements of any other figure can operate or function in any manner similar to that described, but are not limited to such.

The circuit mathematical model 900 is similar to FIG. 2, and to clarify the mathematical analysis of sigma-delta modulator, amplifier 205 is represented by a comparator 900 with Vcm coupled to the positive terminal of comparator 900, and integration node Vint (previously discussed as Vcm) is coupled to the negative terminal of comparator 900. The following analysis is described with reference to two cases—first case when "Chop" is set to logical low and the second case when "Chop" is set to logical high.

In the first case, sigma-delta modulator 900 uses two phases of clock signal to generate the output bit "Digital_out." In the first phase, where CkPh1=1 and CkPh2=0, the input analog signal voltage Vmeas is captured, and at the end of the second phase where CkPh1=0 and CkPh2=1, the digital output bit is generated, which is sampled by the rising edge of CkPh1 at the end of the second phase.

Empirically, we derived the following formula that represents the improvement by the chopper compensation.

Error in Single-ended Operation (at +/−1 sigma in distribution)=C1*Error in Chopper Compensated Operation (at +/−1 sigma in distribution)  (Eq. 1)

where C1 is approximately 3.6, and where coefficient C1 depends on the process technology, which can be derived by the statistical analysis.

Error in Single ended Operation (at +/−1 sigma in distribution)=C2*Delta of ADC reading for ADC_Chop=0 and 1 (at +/−1 sigma in distribution)  (Eq. 1)

where C2 is approximately 0.52, and where co-efficient C2 depends on the process technology, which can be derived by the statistical analysis.

During the first phase where CkPh1=1 and CkPh2=0, the charge of the capacitor $C_{bkt}$ is given as:

$$Q_{BKT}^+ = -Q_{BKT}^- = C_{BKT}(V_{MEAS} - V_{CM}) \quad \text{(Eq. 3)}$$

where Vcm≈Vint due to the virtual short of the comparator 900.

During the second phase where CkPh1=0 and CkPh2=1, the charge at the capacitor $C_{bkt}$ is:

$$Q_{BKT}^+ = -Q_{BKT}^- = C_{BKT}(V_{REF} \cdot \text{DigOut} - V_{CM}) \quad \text{(Eq. 4)}$$

where Vcm≈Vint due to the virtual short of the comparator (or amplifier) 900.

During the second phase where CkPh1=0 and CkPh2=1, the charge of the capacitor $C_{tnk}$ is:

$$Q_{TNK}^+ = C_{BKT}(V_{REF} \cdot \text{DigOut} - V_{CM}) - \\ C_{BKT}(V_{MEAS} - V_{CM}) + Z^{-1} Q_{TNK}^+ \\ = C_{BKT}(V_{REF} \cdot \text{DigOut} - V_{MEAS}) + Z^{-1} Q_{TNK}^+, \quad \text{(Eq. 5)}$$

where $Z^{-1} Q_{TNK}^+$ represents the charge stored in $C_{TNK}$ in one cycle earlier Eq. 5 can be rewritten as follows:

$$Q_{TNK}^+ = -Q_{TNK}^- = \frac{C_{BKT}}{(1-Z^{-1})}(V_{REF} \cdot \text{DigOut} - V_{MEAS}) \quad \text{(Eq. 6)}$$

As a result, the integrator output signal voltage (Vcomp_in) can be described as follows:

$$V_{COMP\_IN} = \quad \text{(Eq. 7)} \\ V_{CM} - \frac{Q_{TNK}^+}{C_{TNK}} = V_{CM} - \frac{C_{BKT}}{C_{TNK}} \frac{1}{(1-Z^{-1})}\left(\begin{array}{c} V_{REF} \cdot \text{DigOut} - \\ V_{MEAS} \end{array}\right)$$

The digital output and the integrator output has the following relationship:

$$\text{DigOut} = Z^{-1}(V_{COMP\_IN} - V_{CM}) + N, \quad \text{(Eq. 8)}$$

where N represents the quantization noise
The following equation can be derived Eq. 8.

$$DigOut = -\frac{C_{BKT}}{C_{TNK}} \frac{Z^{-1}}{(1-Z^{-1})}(V_{REF} \cdot DigOut - V_{MEAS}) + N \quad \text{(Eq. 9)}$$

By rewriting (Eq. 9), we get the following formula:

$$DigOut = STF \cdot V_{MEAS} + NTF \cdot N, \quad \text{(Eq. 10)}$$

where $$NTF(NoiseTransferFunction) = \frac{C_{TNK}(1-Z^{-1})}{C_{TNK}(1-Z^{-1}) + C_{BKT}V_{REF}Z^{-1}},$$

$$STF(Signal\ TransferFunction) = \frac{C_{BKT}Z^{-1}}{C_{TNK}(1-Z^{-1}) + C_{BKT}V_{REF}Z^{-1}}$$

Now, let $Z = e^{j2\pi fT}$,
where f is the frequency of the measured signal, and (1/T) is the sampling frequency of ADC
$Z \to 1$ (i.e., when Z approaches 1) when the oversampling rate $$((1/T)/f)$$

increases. As a result, with very high oversampling rate (>1000×)

$$\text{when}\left(\left(\left(\frac{1}{T}\right)/f\right) \to 0\right): STF \to (1/V_{REF})\ \text{and}\ NTF \to 0 \quad \text{(Eq. 11)}$$

And finally, $$\text{when}\left(\left(\left(\frac{1}{T}\right)/f\right) \to 0\right): \text{Probability}(DigOut = 1) \to \quad \text{(Eq. 12)}$$

$$(V_{MEAS}/V_{REF})$$

Eq. 12 illustrates that with enough oversampling rate, the pulse density of the output binary stream from the sigma-delta modulator reaches to (Vmeas/Vref), even without being impacted by the variations of the inverter amplifier 900 trip point Vcm, the size of the capacitor $C_{bkt}$ and $C_{tnk}$, and the level of the power supply (Vcc). Since the ADC operation may not be impacted by the parameters that depend on the process technology, as shown above, the ADC may operate without any calibration, which makes the embodiment of the ADC very useful on HVM (high volume manufacturing) environment.

In the second case, during the first phase where CkPh1=1 and CkPh2=0, the charge of the capacitor $C_{bkt}$ is given as:

$$Q_{BKT}^+ = -Q_{BKT}^- = C_{BKT}(V_{REF} \cdot DigOut - V_{CM}) \quad \text{(Eq. 13)}$$

where Vcm≈Vint due to the virtual short of the comparator 900.

During the second phase where CkPh1=0 and CkPh2=1, the charge of the capacitor $C_{bkt}$ is:

$$Q_{BKT}^+ = -Q_{BKT}^- = C_{BKT}(V_{MEAS} - V_{CM}) \quad \text{(Eq. 14)}$$

where Vcm≈Vint due to the virtual short of the comparator 900.

During the second phase where CkPh1=0 and CkPh2=1, the charge of the capacitor $C_{tnk}$ is given as:

$$Q_{TNK}^+ = C_{BKT}(V_{MEAS} - V_{CM}) - \quad \text{(Eq. 15)}$$
$$C_{BKT}(V_{REF} \cdot DigOut - V_{CM}) + Z^{-1}Q_{TNK}^+$$
$$= C_{BKT}(V_{MEAS} - V_{REF} \cdot DigOut) + Z^{-1}Q_{TNK}^+,$$

where $Z^{-1}Q_{TNK}^+$ represents the charge stored in $C_{TNK}$ in one cycle earlier Eq. 15 can be rewritten as follows:

$$Q_{TNK}^+ = -Q_{TNK}^- = \frac{C_{BKT}}{(1-Z^{-1})}(V_{MEAS} - V_{REF} \cdot DigOut) \quad \text{(Eq. 16)}$$

As a result, the integrator output signal voltage (Vcomp_in) can be written as follows:

$$V_{COMP\_IN} = V_{CM} - \frac{Q_{TNK}^+}{C_{TNK}} = \quad \text{(Eq. 17)}$$
$$V_{CM} - \frac{C_{BKT}}{C_{TNK}} \frac{1}{(1-Z^{-1})}(V_{MEAS} - V_{REF} \cdot DigOut)$$

The digital output (DigOut, which is same as Digital_out) and the integrator output has the following relationship:

$$DigOut = Z^{-1}(V_{COMP\_IN} - V_{CM}) + N', \quad \text{(Eq. 18)}$$

where N' represents the quantization noise
From Eq. 18, the following equation can be derived:

$$DigOut = -\frac{C_{BKT}}{C_{TNK}} \frac{Z^{-1}}{(1-Z^{-1})}(V_{REF} \cdot DigOut - V_{MEAS}) + N, \quad \text{(Eq. 19)}$$

where $N = 1 - N'$

By rewriting Eq. 19, we get the following formula:

$$DigOut = STF \cdot V_{MEAS} + NTF \cdot N, \quad \text{(Eq. 20)}$$

where $$NTF(NoiseTransferFunction) = \frac{C_{TNK}(1-Z^{-1})}{C_{TNK}(1-Z^{-1}) + C_{BKT}V_{REF}Z^{-1}},$$

$$STF(Signal\ TransferFunction) = \frac{C_{BKT}Z^{-1}}{C_{TNK}(1-Z^{-1}) + C_{BKT}V_{REF}Z^{-1}}$$

Eq. 20 turns out to be exactly same as Eq. 10. It means that both cases, i.e., when Chop=0 and Chop=1, are functionally equivalent. From Eq. 7, $$V_{COMP\_IN} = V_{CM} - \frac{Q_{TNK}^+}{C_{TNK}} = \quad \text{(Eq. 21)}$$
$$V_{CM} - \frac{C_{BKT}}{C_{TNK}} \frac{1}{(1-Z^{-1})}(V_{REF} \cdot DigOut - V_{MEAS})$$

-continued $$V_{COMP\_IN} = V_{CM} - \frac{Q_{TNK}^+}{C_{TNK}} = \quad \text{(Eq. 22)}$$

$$V_{CM} - \frac{C_{BKT}}{C_{TNK}} \frac{1}{(1-Z^{-1})}(V_{MEAS} - V_{REF} \cdot DigOut)$$

From Eq. 21 and Eq. 22, the voltage level of output of the integrator Vcomp_in in both cases (Chop=0 and Chop=1) are symmetric with each other with respect to Vcm, so that it has a capability to reject the common-mode noise such as the AC supply noise or DC leakage from the integrator storage node just as, to a certain extent, the fully differential design does.

Figure 10:
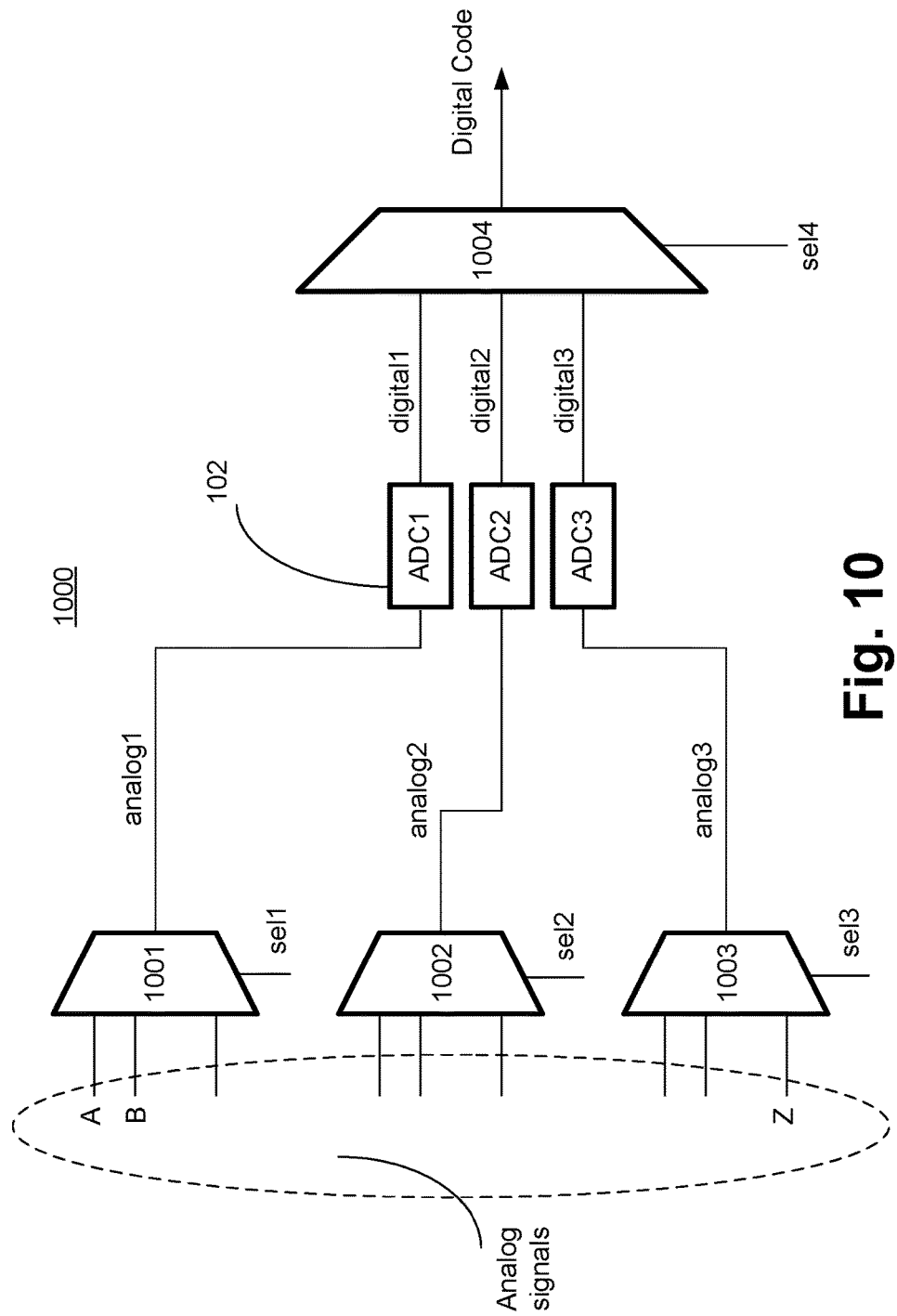
FIG. 10 is a design for test (DFT) circuit with the ADC with chopping and auto-zero functions, according to one embodiment of the disclosure.

FIG. 10 is a design for test (DFT) circuit 1000 with the ADCs having chopping and auto-zero functions, according to one embodiment of the disclosure. It is pointed out those elements of FIG. 10 having the same reference numbers (or names) as the elements of any other figure can operate or function in any manner similar to that described, but are not limited to such. In one embodiment, DFT circuit 1000 provides visibility to analog signals in digital form.

In one embodiment, DFT circuit 1000 comprises analog multiplexers 1001, 1002, and 1003 that are operable to provide analog voltages analog1, analog2, and analog3 respectively by selecting from among many analog signals (A though Z) via select signals sel1, sel2, and sel3 respectively. In one embodiment, analog voltages analog1, analog2, and analog3 are converted by ADC1, ADC2, and ADC3 (collectively 102) into their respective digital forms digital1, digital2, and digital3 respectively.

In one embodiment, DFT circuit 1000 comprises a digital multiplexer 1004 which is operable to select from among the digital signals (e.g., digital1, digital2, and digital3) an output signal Digital Code via select signal sel4. While the embodiments discuss three analog multiplexers (1001, 1002, and 1003), three ADCs, and one digital multiplexer 1004, any number of analog multiplexers, ADCs, and digital multiplexers may be used. In one embodiment, analog signals may be converted into digital form by ADCs 102 and then the digital signals may be routed over long distances without losing data.

Figure 11:
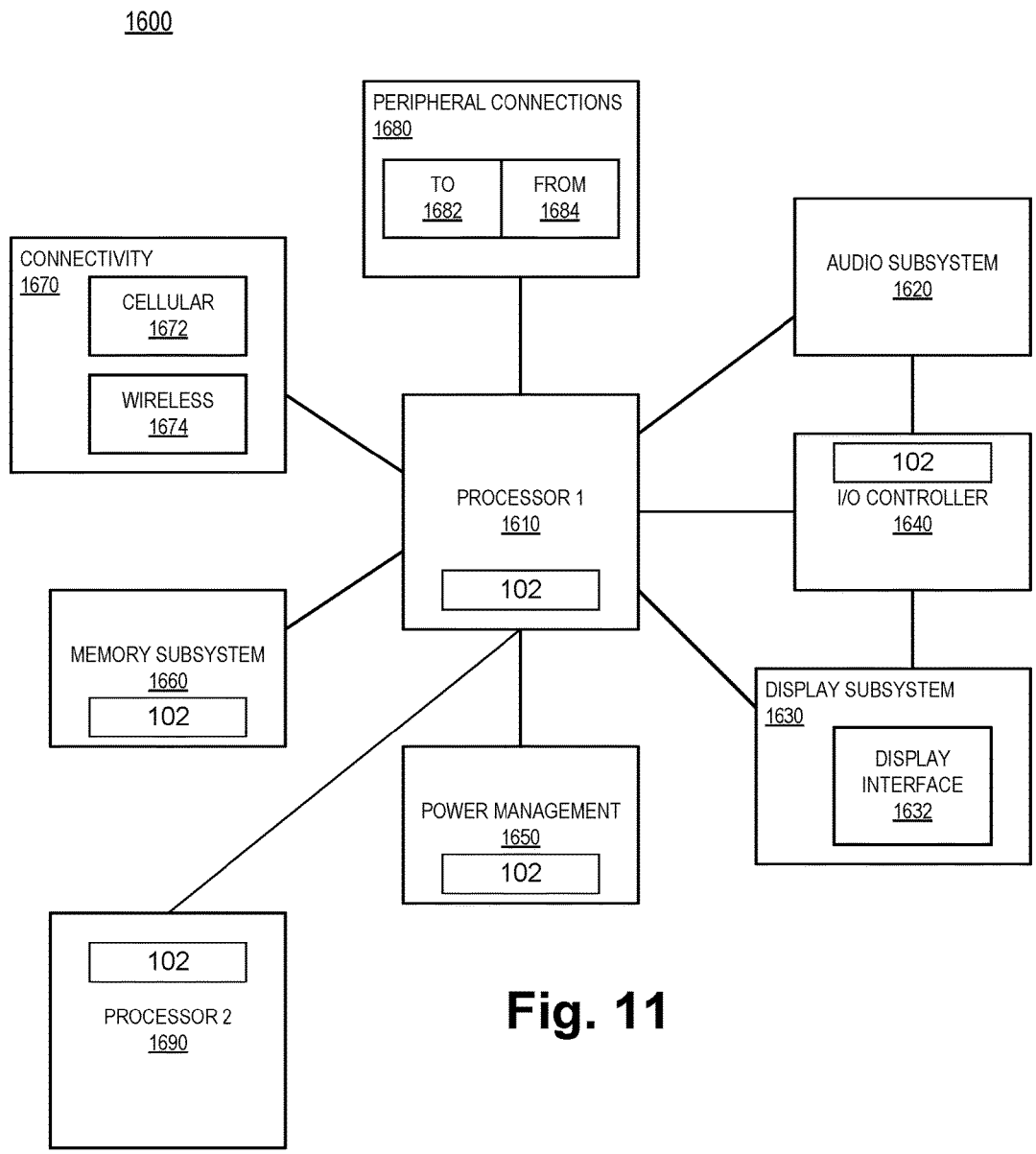
FIG. 11 is a smart device or a computer system or SOC (System-on-chip) with the ADC, according to one embodiment of the disclosure.

FIG. 11 is a smart device 1600 or a computer system or SOC (System-on-chip) with the ADC (e.g., 102), according to one embodiment of the disclosure. FIG. 11 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with ADC 102 of FIG. 1 (or any of the ADCs discussed in the embodiments), and a second processor 1690 with ADC 102 of FIG. 1 (or any of the ADCs discussed in the embodiments), according to the embodiments discussed herein. Other blocks of the computing device with I/O drivers may also include ADC 102 of FIG. 1 (or any of the ADCs discussed in the embodiments). The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a sigma-delta modulator to receive an analog signal, the sigma-delta modulator operable to perform chopping to cancel common-mode noise; and one or more counters coupled to the sigma-delta modulator to generate a digital code representative of the analog signal.

In one embodiment, the apparatus further comprises: another sigma-delta modulator to receive the analog signal, the other sigma-delta modulator operable to perform chopping to cancel common-mode noise, the other sigma-delta modulator and the sigma-delta modulator for generating a pseudo-differential signal corresponding to the analog signal. In one embodiment, the sigma-delta modulator is operable to perform chopping by switching between at least two clock signal phases for at least two switches of the sigma-delta modulator.

In one embodiment, the sigma-delta modulator comprises an integrator including a cascode inverter amplifier. In one embodiment, the sigma-delta modulator is operable to perform auto-zeroing operation to cancel DC offset of the cascode inverter amplifier. In one embodiment, the sigma-delta modulator comprises a switch including: at least two p-type transistors coupled together in series and controllable by a common signal, the at least two p-type transistors having their bulk terminals coupled to a common terminal of the at least two p-type transistors; and at least two n-type transistors coupled together in series and controllable by an inverse of the common signal, the at least two n-type transistors having their bulk terminals coupled to a non-ground common terminal of the at least two n-type transistors, wherein the at least two p-type transistors are coupled in parallel to the at least two n-type transistors.

In one embodiment, the sigma-delta modulator comprises a switch including: at least two p-type transistors coupled together in series and controllable by a common signal, the at least two p-type transistors having their bulk terminals coupled to a common terminal of the at least two p-type transistors; and at least two n-type transistors coupled together in series and controllable by an inverse of the common signal, the at least two n-type transistors having their bulk terminals coupled to a ground terminal of the at least two n-type transistors, wherein the at least two p-type transistors are coupled in parallel to the at least two n-type transistors.

In one embodiment, the sigma-delta modulator comprises a switch including: at least two p-type transistors coupled together in series and controllable by a common signal, the at least two p-type transistors having their bulk terminals coupled to a common terminal of the at least two p-type transistors. In one embodiment, the sigma-delta modulator comprises metal capacitors.

In another example, the apparatus comprises: a circuit to generate an analog signal; and an ADC to receive, directly or indirectly, the analog signal and to convert it to a digital code, the ADC including: a sigma-delta modulator to receive the analog signal, the sigma-delta modulator operable to perform chopping from an input of an integrator of the sigma-delta modulator; and one or more counters coupled to the sigma-delta modulator to generate the digital code representative of the analog signal.

In one embodiment, the sigma-delta modulator is operable to perform chopping by switching between at least two clock signal phases for at least two switches of the sigma-delta modulator. In one embodiment, the integrator includes a cascode inverter amplifier. In one embodiment, the sigma-delta modulator is operable to perform auto-zeroing operation to cancel DC offset of the cascode inverter amplifier. In one embodiment, the sigma-delta modulator comprises a switch including: at least two p-type transistors coupled together in series and controllable by a common signal, the at least two p-type transistors having their bulk terminals coupled to a common terminal of the at least two p-type transistors.

In another example, a system comprises: a memory; a processor, coupled to the memory, the processor comprises: a sigma-delta modulator to receive an analog signal, the sigma-delta modulator operable to perform chopping; and one or more counters coupled to the sigma-delta modulator to generate a digital code representative of the analog signal; and a wireless interface for allowing the processor to communicate with another device. In one embodiment, the system further comprises a display unit.

In one embodiment, the sigma-delta modulator is operable to perform chopping by switching between at least two clock signal phases for at least two switches of the sigma-delta modulator. In one embodiment, the sigma-delta modulator comprises an integrator including a cascode inverter amplifier. In one embodiment, the sigma-delta modulator is operable to perform auto-zeroing operation to cancel DC offset of the cascode inverter amplifier. In one embodiment, the sigma-delta modulator comprises a switch including: at least two p-type transistors coupled together in series and controllable by a common signal, the at least two p-type transistors having their bulk terminals coupled to a common terminal of the at least two p-type transistors.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a reference generator to provide a reference voltage;
a sigma-delta modulator coupled to the reference generator, wherein the sigma-delta modulator is to receive an analog signal; and
a finite state machine (FSM) coupled to an output of the sigma-delta modulator, wherein the FSM is to provide a digital code representing the analog signal; and a first multiplexer coupled to the reference generator.

2. The apparatus of claim 1, wherein the sigma-delta modulator comprises an amplifier and a circuit to perform auto zero correction of the amplifier.

3. The apparatus of claim 2, wherein the sigma-delta modulator comprises a chopper which is operable to cancel common-mode noise from the amplifier.

4. The apparatus of claim 2, wherein the amplifier and the circuit are part of an integrator.

5. The apparatus of claim 2, wherein the amplifier comprises an inverter.

6. The apparatus of claim 1, wherein the first multiplexer is controlled by an input of the FSM.

7. The apparatus of claim 6, wherein the first multiplexer is to selectively provide one of the reference voltage or a digital bit to a first switch.

8. The apparatus of claim 7, comprises a first capacitive device coupled to the first switch and the amplifier.

9. The apparatus of claim 8, comprises a second switch to receive the analog signal, wherein the second switch is coupled to the first capacitive device.

10. The apparatus of claim 9 comprises a third switch coupled to an output of the amplifier and the second switch.

11. The apparatus of claim 10 comprises:
a fourth switch coupled to the second switch; and
a second capacitive device coupled in series with the fourth switch, wherein the second capacitive device is also coupled to an output of the amplifier.

12. The apparatus of claim 11 comprises a buffer coupled to an output of the amplifier.

13. The apparatus of claim 12 comprises a second multiplexer coupled to an output of the buffer.

14. The apparatus of claim 13 comprises a sampler coupled to an output of the second multiplexer, wherein an output of the sampler is to control the first multiplexer.

15. The apparatus of claim 1, wherein the FSM includes at least two counters.

16. An apparatus comprising:
   means for coupling an input analog signal to a first capacitor during a first phase of a clock signal;
   means for closing a first switch of an integrator during the first phase such that an input and an output of an amplifier of the integrator are electrically shorted;
   means for coupling one of a reference signal or a logic signal to the first capacitor during a second phase of the clock signal; and
   means for closing a second switch of the integrator during the second phase, the second switch to couple the input and the output of the amplifier via a second capacitor.

17. The apparatus of claim 16 comprises means for controlling a third switch using the first phase, the third switch to couple one of the reference signal or the logic signal to the first capacitor during a chopping mode.

18. The apparatus of claim 17 comprises means for controlling a fourth switch using the second phase, the fourth switch to couple the input analog signal to the first capacitor during the chopping mode.

19. The apparatus of claim 18, wherein the means for coupling one of the reference signal or the logic signal to the first capacitor uses a logic state of the output of the amplifier.

20. An apparatus comprising:
   an amplifier having an input and an output, wherein the amplifier is a single-ended amplifier;
   a first switch coupled to the input and the output;
   a first capacitive device;
   a second switch coupled in series with the first capacitive device, wherein the first capacitive device and the second switch are together coupled to the input and the output;
   a buffer directly coupled to the output;
   a multiplexer coupled to an output of the buffer; and
   a second capacitive device coupled to the input.

21. The apparatus of claim 20, comprises a third switch coupled to the second capacitive device.

22. The apparatus of claim 21 comprises a fourth switch coupled to the second capacitive device.

23. The apparatus of claim 21 wherein the multiplexer is a first multiplexer, wherein the apparatus comprises a second multiplexer coupled to the third switch, and wherein the second multiplexer is to provide one of a reference voltage, logic high, or a logic low.

24. The apparatus of claim 23 wherein the first multiplexer is to provide as output to a sampler one of an inverted version of the output of the buffer or the output of the buffer.

25. An apparatus comprising:
   an inverter having an input and output;
   a first capacitive device coupled to the input of the inverter, wherein one terminal of the capacitive device is switchably coupled to one of at least two nodes; and
   a buffer directly coupled to the output of the inverter and a multiplexer coupled to an output of the buffer.

26. The apparatus of claim 25 comprises:
   a second capacitive device;
   a first switch coupled to the input and the output; and
   a second switch coupled in series with the second capacitive device, wherein the second capacitive device and the second switch are together coupled to the input and the output.

27. The apparatus of claim 26 comprises:
   a third switch coupled to the second capacitive device; and
   a fourth switch coupled to the second capacitive device.

28. The apparatus of claim 27 wherein the multiplexer is a first multiplexer, wherein the first multiplexer is to provide as output to a sampler one of an inverted version of the output of the buffer or the output of the buffer, comprises:
   a second multiplexer coupled to the third switch, wherein the second multiplexer is to provide one of a reference voltage, logic high, or a logic low.

* * * * *